United States Patent
Bal et al.

(10) Patent No.: US 12,542,559 B2
(45) Date of Patent: Feb. 3, 2026

(54) OFFSET CALIBRATION FOR AN ANALOG FRONT-END SYSTEM VARIABLE-GAIN AMPLIFIER

(71) Applicant: STMicroelectronics International N.V., Geneva (CH)

(72) Inventors: Ankur Bal, Greater Noida (IN); Anubhuti Chopra, Delhi (IN)

(73) Assignee: STMicroelectronics International N.V., Geneva (CH)

( * ) Notice: Subject to any disclaimer, the term of this patent is extended or adjusted under 35 U.S.C. 154(b) by 78 days.

(21) Appl. No.: 18/482,333

(22) Filed: Oct. 6, 2023

(65) Prior Publication Data

US 2024/0146324 A1   May 2, 2024

Related U.S. Application Data

(60) Provisional application No. 63/420,465, filed on Oct. 28, 2022.

(51) Int. Cl.
   *H03M 1/10*   (2006.01)
   *H03M 1/12*   (2006.01)
   *H03M 1/18*   (2006.01)

(52) U.S. Cl.
   CPC ....... *H03M 1/1028* (2013.01); *H03M 1/1038* (2013.01); *H03M 1/185* (2013.01); *H03M 1/12* (2013.01)

(58) Field of Classification Search
   CPC .. H03M 1/1028; H03M 1/1038; H03M 1/185; H03M 1/12
   USPC ................................................ 341/139, 155
   See application file for complete search history.

(56) References Cited

U.S. PATENT DOCUMENTS

| | | | |
|---|---|---|---|
| 6,985,098 B2 * | 1/2006 | Lee | H03F 1/304 |
| | | | 341/120 |
| 7,405,683 B1 * | 7/2008 | Perrin | H03M 1/185 |
| | | | 341/139 |
| 7,693,237 B2 | 4/2010 | Mehrnia et al. | |
| 7,755,522 B1 | 7/2010 | Song et al. | |

OTHER PUBLICATIONS

Sovcik et al., "On-Chip Digital Calibration for Analog ICs Towards Improved Reliability in Nanotechnologies," 2020 18th International Conference on Emerging eLearning Technologies and Applications (ICETA), 2020. (6 pages).

* cited by examiner

*Primary Examiner* — Khai M Nguyen
(74) *Attorney, Agent, or Firm* — Seed Intellectual Property Law Group LLP

(57) ABSTRACT

Offset calibration for an analog front-end system is provided. The analog front-end system includes a variable-gain amplifier, and the calibration mitigates an offset error of the variable-gain amplifier. Calibration is based on a difference-based estimation technique combined with digital iteration. Difference-based estimation includes measuring different digital output signals from an analog-to-digital converter for different respective gains of the variable-gain amplifier. The digital iteration is utilized to estimate offsets values which converge a digital output difference to a target of zero volts.

20 Claims, 3 Drawing Sheets

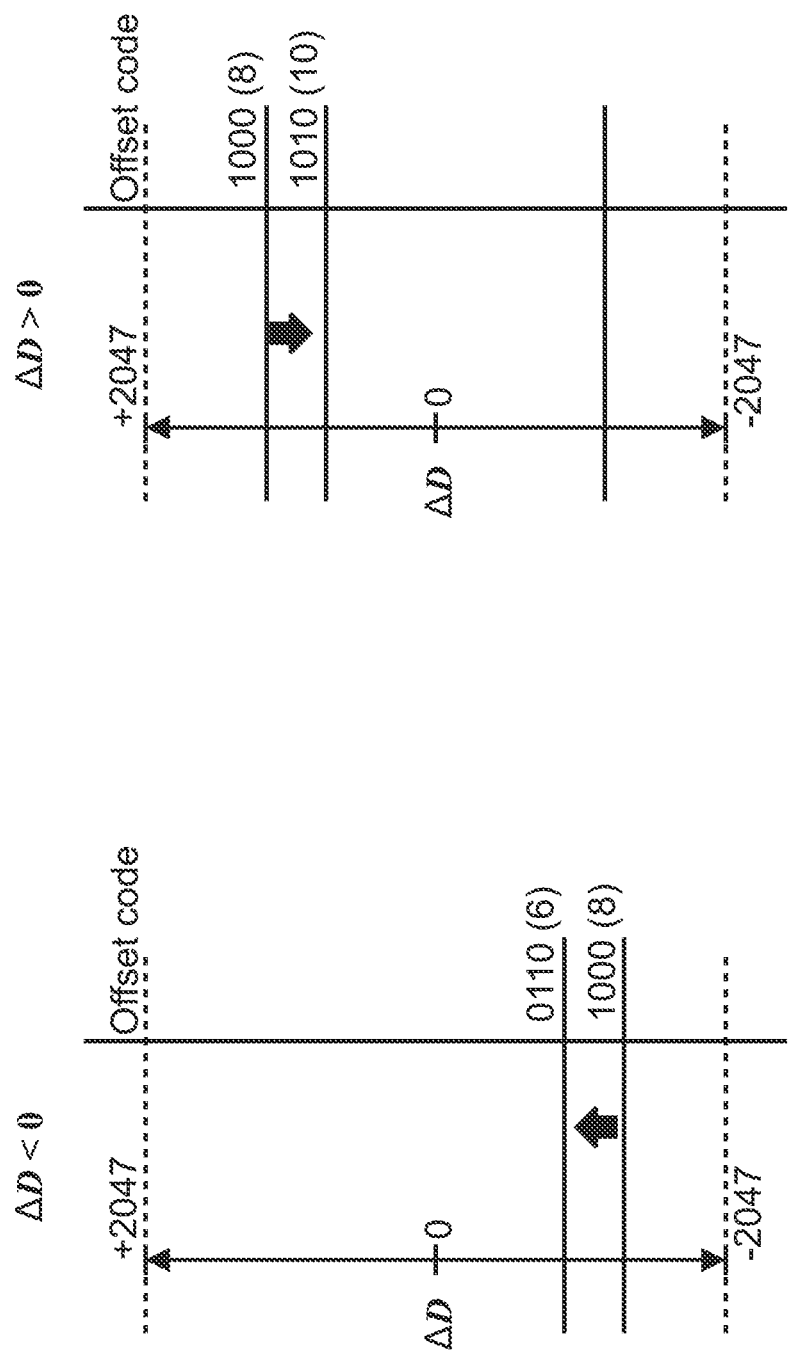

OFFSET CALIBRATION FOR AN ANALOG FRONT-END SYSTEM VARIABLE-GAIN AMPLIFIER

BACKGROUND

Technical Field

The present disclosure is directed to offset calibration in an analog front-end system. In particular, an offset error in a variable-gain amplifier is mitigated by digital calibration.

Description of the Related Art

Analog front-end (AFE) systems generally include a combination of signal conditioning circuitry. The signal conditioning circuitry receives an analog signal from a communication device or a sensor, among others, and converts the analog signal to a low-noise and high-dynamic range signal. Typically, an analog front-end system includes one or more amplifiers, one or more filters, one or more converters or a combination thereof. The analog front-end performs signal conditioning and transmits data to a next stage of a communication or a measurement system, among others. For instance, in a receiver of a communication system, an analog front-end system includes radio-frequency (RF) components followed by a variable gain amplifier. The variable-gain amplifier transmits an amplified signal to an analog-to-digital converter to generate a respective digital signal. A dynamic range of the digital signal is a characteristic of the analog front-end system. The dynamic range is limited by an offset error in the variable-gain amplifier.

BRIEF SUMMARY

Offset calibration in an analog front-end system is provided. An offset error is reduced by calibrating the analog front-end before operation. Digital calibration is provided to mitigate an offset error of a variable-gain amplifier in the analog front-end system. Digital calibration is based on a difference-based estimation technique combined with digital iteration.

In some embodiments of the present disclosure, the analog front-end system includes the variable-gain amplifier coupled to an analog-to-digital converter. Each of the variable-gain amplifier and the analog-to-digital converter is modeled to include an adder which adds an offset voltage into respective input signals of the variable-gain amplifier and the analog-to-digital converter as well as an amplifier to boost an output signal of the adder. Coupling two different offset values and amplification of the output results in the offset error which limits a dynamic range of a digital output of the analog front-end system. A difference-based estimation technique is used to estimate an offset voltage of the variable-gain amplifier.

The difference-based estimation technique includes measuring different digital output signals of the analog-to-digital converter for different respective gain values of the variable-gain amplifier. A first output is determined for a first gain, and a second output is determined for a second gain. A difference between the first and second outputs is minimized to mitigate the offset error. Digital iteration is utilized to shift the output difference to a target point that has a zero value. The estimated offsets and corresponding gains of the variable-gain amplifier are stored in relation with binary codes in a memory of the analog front-end system. During operation, an offset code is retrieved from memory and used to operate the analog front-end.

BRIEF DESCRIPTION OF THE SEVERAL VIEWS OF THE DRAWINGS

FIG. 3A shows an example of iterative compensating offset adjustment.
FIG. 3B shows an example of iterative compensating offset adjustment.

DETAILED DESCRIPTION

Figure 1:
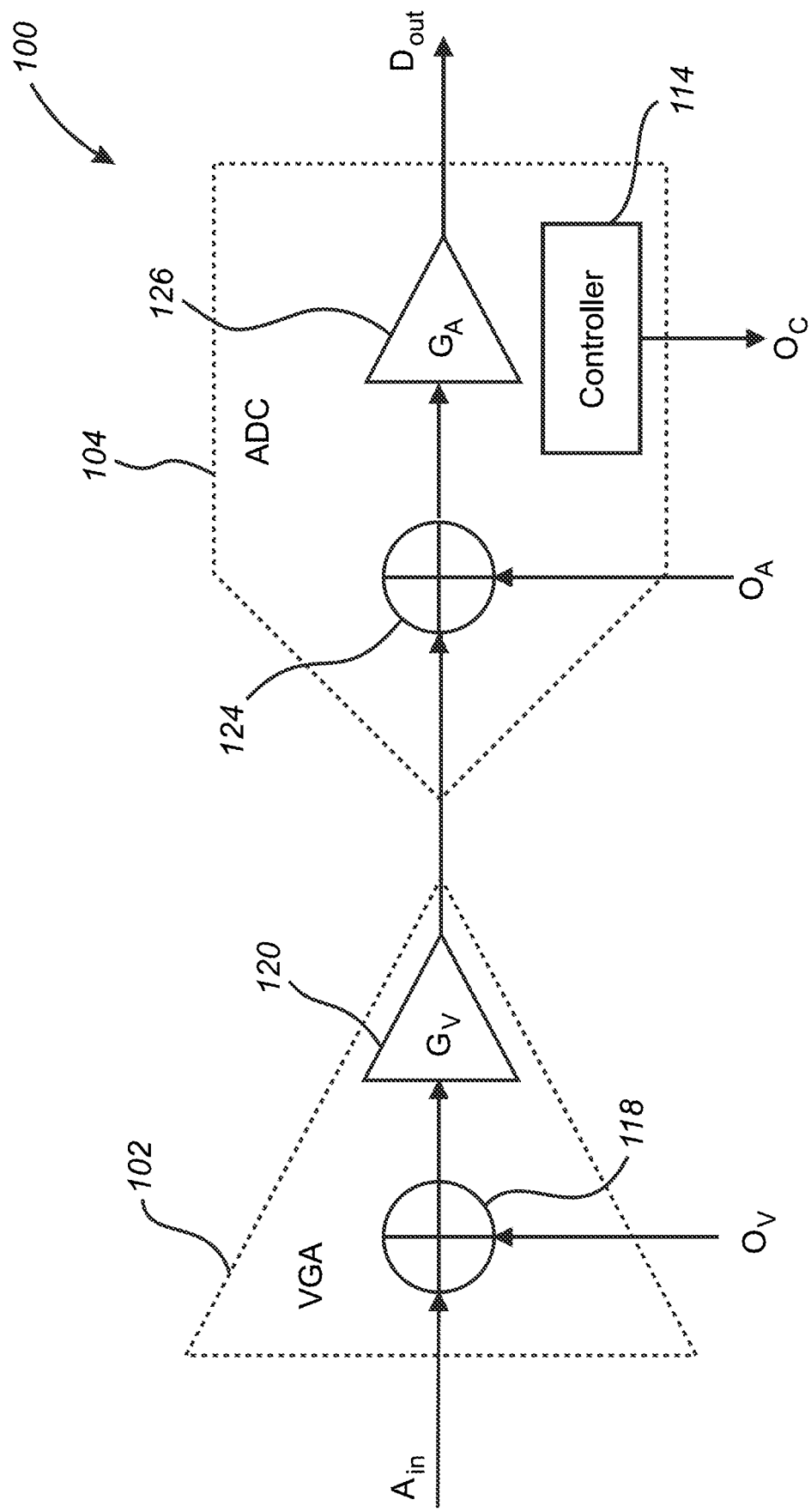
FIG. 1 shows an analog front-end system.

FIG. 1 shows an analog front-end (AFE) system 100. The analog front-end system 100 may be a set of conditioning circuitry operative to interface an analog domain to a digital domain and convert an analog signal ($A_{in}$) in the analog domain to a digital signal ($D_{out}$) in the digital domain. For example, the analog front-end system 100 may be part of a receiver and configured to convert the analog signal ($A_{in}$) as received by an antenna to the digital signal ($D_{out}$).

The analog front-end system 100 includes a variable-gain amplifier (VGA) 102 and an analog-to-digital converter (ADC) 104. The variable-gain amplifier 102 may be an amplifier having a gain ($G_V$) that is controllable and settable. The analog-to-digital converter 104 may be circuitry operate to transform a signal from analog representation to digital representation. The analog-to-digital converter 104 is also associated with a gain ($G_A$).

The variable-gain amplifier 102 has an input and an output. The analog-to-digital converter 104 has an input and an output, whereby the input of the analog-to-digital converter 104 is coupled to the output of the variable-gain amplifier 102. The input of the variable-gain amplifier 102 receives the analog signal ($A_{in}$) and the output of the analog-to-digital converter 104 outputs the digital signal ($D_{out}$).

The variable-gain amplifier 102 and the analog-to-digital converter 104 may respectively introduce an offset at their respective inputs. The offsets of the variable-gain amplifier 102 and the analog-to-digital converter 104 are parasitic. In FIG. 1, the variable-gain amplifier 102 is modeled to include a first adder 118 that adds a first offset ($O_V$) to the analog signal ($A_{in}$). The analog-to-digital converter 104 is modeled to include a second adder 124 that adds a second offset ($O_A$) to the input signal of the analog-to-digital converter 104. The first and second adders 118, 124 are shown to model the addition of parasitic offsets. Thus, the variable-gain amplifier 102 and the analog-to-digital converter 104 may not include the first and second adders 118, 124, respectively, whereas in fact the parasitic offsets are parasitically added to the received signals by each of the variable-gain amplifier 102 and the analog-to-digital converter 104.

The analog-to-digital converter 104 includes a controller 114 configured to set a compensating offset ($O_C$). The controller 114 provides an offset code corresponding to the compensation offset ($O_C$) and sends the code to the variable-gain amplifier 102. In response, the variable-gain amplifier 102 mitigates the first offset ($O_V$) according to the received offset code from the controller 114. The controller 114 may be digital circuitry, a microcontroller, a processor or a microprocessor, among others. The controller 114 may also include an arithmetic and logic unit (ALU) configured to determine a gain code or an offset code for the variable-gain amplifier 102 as described herein.

In addition to the first adder 118, the variable-gain amplifier 102 includes a variable amplifier 120. The first adder 118 has first and second inputs and an output. The first input of the first adder 118 configured to receive the analog signal ($A_{in}$) and the second input of the first adder 118 is modelled to represent the first offset ($O_V$). The variable amplifier 120 has an input and an output. The input of the variable amplifier 120 is coupled to the output of the first adder 118, and the output of the variable amplifier 120 is coupled to the input of the analog-to-digital converter 104.

The analog-to-digital converter 104 includes the second adder 124, an amplifier 126, and the controller 114. The controller 114 controls setting a code for the compensating offset ($O_C$). The analog-to-digital converter 104 may include other components (not shown). The second adder 124 has first and second inputs and an output. The first input of the second adder 124 is coupled to the output of the variable amplifier 120, and the second input of the second adder 124 is configured to receive the second offset ($O_A$). The amplifier 126 has an input coupled to the output of the second adder 124. The amplifier 126 has an output that is configured to output the digital signal ($D_{out}$).

Various conditions (such as, wear and tear, aging or electrical stress, among others) as well as process conditions (such as, voltage and temperature fluctuations) cause a drift in the electrical characteristics of circuit components of the analog front-end system 100. The effect of the conditions may be manifested as the first and second offsets ($O_V$, $O_A$) or changes thereof. The offsets ($O_V$, $O_A$) negatively impact the performance of the system 100 and reduce a dynamic range of the digital signal ($D_{out}$).

The controller 114 generates the offset code corresponding to the compensating offset ($O_C$) and send the offset code to the variable-gain amplifier 102 to mitigate the first offset ($O_V$). The first offset ($O_V$) is parasitic, and adding the compensating offset ($O_C$) at least partially neutralizes and mitigates the first offset ($O_V$). As described herein, the first offset ($O_V$) is mitigated independently of the second offset ($O_A$). Mitigation of the first offset ($O_V$) may be independent of the second offset ($O_A$) and the gain ($G_A$) of the amplifier 126.

The digital signal ($D_{out}$) is corresponding to values of the analog signal ($A_{in}$), the first offset ($O_V$), the gain ($G_V$) of the variable amplifier 120, the second offset ($O_A$), and the gain ($G_A$) of the amplifier 126. Accordingly, the digital signal ($D_{out}$) may be represented as:

$$D_{out} = G_A(G_V(A_{in} + O_V) + O_A) = G_A G_V A_{in} + G_A G_V O_V + G_A O_A. \quad \text{Equation (1)}$$

In Equation (1), the term $G_A G_V A_{in}$ is dependent on the analog signal ($A_{in}$) and is nullified if the analog signal ($A_{in}$) is zero volts. The term $G_A O_A$ depends on both the gain and the offset of the analog-to-digital converter 104 (and not the variable-gain amplifier 102). Thus, by refraining from altering the gain ($G_A$) of the amplifier 126 of the analog-to-digital converter 104 as well as the second offset ($O_A$), the term $G_A O_A$ may be neutralized (or 'cancelled out') in a difference-based technique.

During calibration, the controller 114 sets the analog signal ($A_{in}$) to zero volts (e.g., no input is provided) and sets the gain ($G_A$) of the analog-to-digital converter 104 to a non-zero value. The controller 114 sets gain ($G_V$) of the variable amplifier 120 to a first gain value ($G_V = G_1$) and determines a first digital signal ($D1_{out}$) output by the system 100. Then, the controller 114 retains the analog signal ($A_{in}$) at zero volts and also retains the gain ($G_A$) of the analog-to-digital converter 104 at the same non-zero value. The controller 114 sets the gain ($G_V$) of the variable amplifier 120 to a second gain value ($G_V = G_2$). Subsequently, the controller 114 determines a second digital signal ($D2_{out}$) output by the system 100.

The first digital signal ($D1_{out}$) and the second digital signal ($D2_{out}$) are respectively represented as:

$$A_{in}=0, G_V=G_1, D1_{out}=G_A G_1 O_V + G_A O_A \quad \text{Equation (2)}$$

$$A_{in}=0, G_V=G_2, D2_{out}=G_A G_2 O_V + G_A O_A \quad \text{Equation (3)}$$

In Equation (2), the first gain value ($G_1$) that is set for the variable amplifier 120 results in a first digital signal ($D1_{out}$) being generated at the output of the analog-to-digital converter 104. In Equation (3), the second gain value ($G_2$) that is used for the variable amplifier 120 results in a second digital signal ($D2_{out}$) being output at the output of the analog-to-digital converter 104. In various embodiments, the values of the first gain value ($G_1$) and the second gain value ($G_2$) are chosen to optimize or maximize a difference between the first digital signal ($D1_{out}$) and the second digital signal ($D2_{out}$). Consequently, a dynamic range of the output signal of the system 100 is improved. For example, a six-sigma ($6\sigma$) technique for offset calculation may be used to determine the first gain value ($G_1$), the second gain value ($G_2$) or a difference therebetween.

Determining a difference between the first digital signal ($D1_{out}$) and the second digital signal ($D2_{out}$) results in cancellation of the terms $G_A O_A$ that are dependent on the offset and gain of the analog-to-digital converter 104. The difference between the first digital signal ($D1_{out}$) and the second digital signal ($D2_{out}$) may be represented as:

$$D1_{out} - D2_{out} = G_A G_1 O_V + G_A O_A - G_A G_2 O_V - G_A O_A \quad \text{Equation (4)}$$
$$= G_A G_1 O_V - G_A G_2 O_V$$
$$= G_A O_V (G_1 - G_2)$$

In Equation (4), the gain ($G_A$) of the analog-to-digital converter 104, the difference between the first gain value ($G_1$) and the second gain value ($G_2$) and the difference between the first digital signal ($D1_{out}$) and the second digital signal ($D2_{out}$) are known to the controller 114. Accordingly, the controller 114 may determine a value representative of the first offset ($O_V$).

The controller 114 determines a code for the compensating offset ($O_C$) that is sent to the amplifier 126, and the compensating offset ($O_C$) is added to mitigate the first offset ($O_V$) and minimizes the difference between the first digital signal ($D1_{out}$) and the second digital signal ($D2_{out}$) ($|\Delta D| = |D2_{out} - D1_{out}|$). The controller 114 determines the compensating offset ($O_C$) based on the difference between the first digital signal ($D1_{out}$) and the second digital signal ($D2_{out}$).

The compensating offset ($O_C$) is opposite in sign to the first offset ($O_V$) of the variable-gain amplifier 102. For example, if the first offset ($O_V$) is a positive voltage, the compensating offset ($O_C$) is a negative voltage. Compensation is optimized when a magnitude of the compensating offset ($O_C$) is the same as a magnitude of the first offset ($O_V$)

in which case the compensating offset ($O_C$) 'cancels out' the first offset ($O_V$). The controller 114 outputs the compensating offset ($O_C$) or an indication thereof to the variable-gain amplifier 102. After calibration and during operation, the variable-gain amplifier 102 adds the compensating offset ($O_C$) to the analog signal ($A_{in}$) (to mitigate the first offset ($O_V$) modeled at the input of the first adder 118 shown in FIG. 1). The controller 114 may be an internal circuit of the analog-to-digital converter 104. Use of an internal circuit forgoes coupling additional analog circuitry to the variable-gain amplifier 102 for offset correction or mitigation. Further, use of an internal circuit reduces a footprint or Silicon area of the system 100 compared with the case when an external controller is implemented for calibration. In addition, the power consumption of the system 100 is also reduced.

Calibration for compensating offset ($O_C$) determination as described herein may be performed at manufacturing as well as at various times during the lifespan of the system 100. For example, the compensating offset ($O_C$) may be determined or updated according to a time schedule, such as every six months or every year. Environmental conditions, such as temperature and humidity, may cause the electrical characteristics of the system 100 to change thereby altering offset values. In addition, the passage of time and the aging of electrical components also change the electrical characteristics of the system 100.

Figure 2:
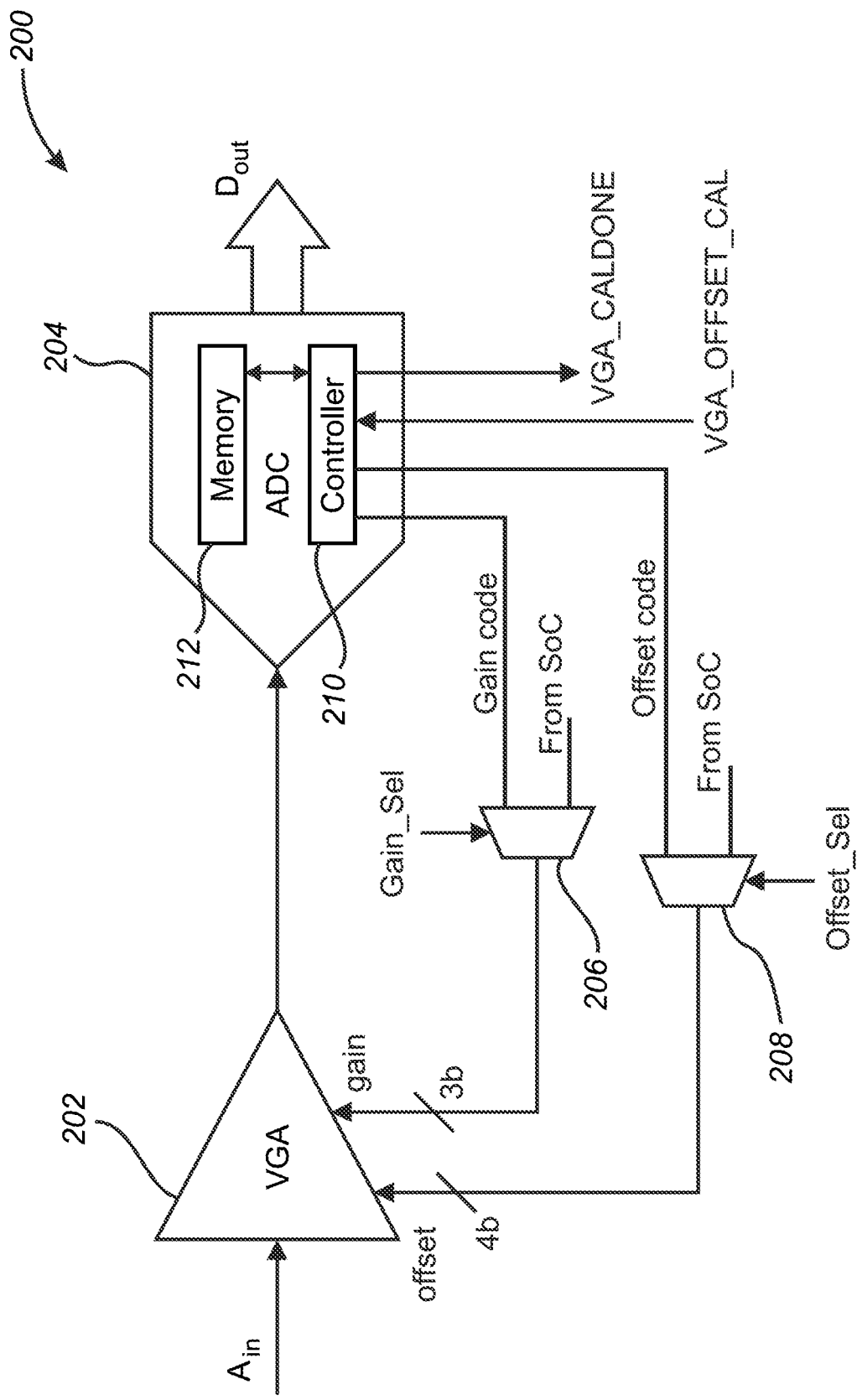
FIG. 2 shows the analog front-end system in accordance with an embodiment.

FIG. 2 shows an analog front-end system 200 in accordance with an embodiment. The system 200 includes a variable-gain amplifier 202, an analog-to-digital converter 204 and first and second multiplexers 206, 208. The variable-gain amplifier 202 has an input and an output. The analog-to-digital converter 204 has an input and an output, whereby the input of the analog-to-digital converter 204 is coupled to the output of the variable-gain amplifier 202. The input of the variable-gain amplifier 202 is configured to receive the analog signal ($A_{in}$) and the output of the analog-to-digital converter 204 is configured to provide the digital signal ($D_{out}$).

The variable-gain amplifier 202 has a gain control input and an offset control input. The analog-to-digital converter 204 includes a controller 210 and memory 212 that are coupled to each other. The memory may be registers (that are used to store values of the digital signal ($D_{out}$) during calibrations), among others. The controller 210 has a gain code output and an offset code output, whereby the gain code output of the analog-to-digital converter 204 is coupled to the gain control input of the variable-gain amplifier 202 and the offset code output of the analog-to-digital converter 204 is coupled to the offset control input of the variable-gain amplifier 202. In addition, the analog-to-digital converter 204 has an offset calibration input configured to receive a signal (VGA_OFFSET_CAL) indicative of whether offset calibration is to be performed. For example, signal (VGA_OFFSET_CAL) may be asserted to command the controller 210 to perform offset calibration. The controller 210 has a calibration completion output configured to output a signal (VGA_CALDONE) indicative of whether offset calibration has been performed by the controller 210. An external circuit such as a system-on-chip (SoC) may be coupled to the offset calibration input and the calibration completion output of the controller 210 and the analog-to-digital converter 204. The external circuit may command the controller to perform offset calibration on the variable-gain amplifier 202 (for example, based on a time schedule) by sending the signal (VGA_OFFSET_CAL) to the analog-to-digital converter 204. In response to completing calibration, the controller 210 of the analog-to-digital converter 204 outputs the signal (VGA_CALDONE) to the external circuit to indicate that calibration has been performed. As described herein, calibration may be repeated when the environmental condition change or after a period of time has passed.

The first multiplexer 206 has a first input coupled to the gain code output of the controller 210, a second input coupled to the external circuit, such as the SoC, and an output coupled to the gain control input of the variable-gain amplifier 202. The second multiplexer 208 has a first input coupled to the offset code output of the controller 210, a second input coupled to the external circuit and an output coupled to the offset control input of the variable-gain amplifier 202. The first multiplexer 206 has a selection input configured to receive a gain selection signal (Gain_Sel). The gain selection signal (Gain_Sel) selects between the gain code being provided by the controller 210 or the external circuit. The second multiplexer 208 has a selection input configured to receive an offset selection signal (Offset_Sel). The offset selection signal (Offset_Sel) selects between the offset code being provided by the controller 210 or the external circuit. In an embodiment, the multiplexers 206, 208 may be dispensed with or removed, and the gain code and the offset code may directly be provided from the analog-to-digital converter 204 to the variable-gain amplifier 202 without allowing an option for the external circuit to supply the gain code using the first multiplexer 206 or the offset code using the second multiplexer 208.

Asserting the gain selection signal (e.g., setting the gain selection signal to a logical one) selects the analog-to-digital converter 204 as the source of the gain code to the variable-gain amplifier 202. Deasserting the gain selection signal selects the external circuit as the source of the gain code. Asserting the offset selection signal selects the analog-to-digital converter 204 as the source of the offset code provided to the variable-gain amplifier 202. Deasserting the offset selection signal selects the external circuit as the source of the offset code. Alternatively, the convention described herein may be reversed.

The analog-to-digital converter 204 (or the controller 210 thereof) receives the signal (VGA_OFFSET_CAL) indicating that offset calibration is to be performed. The controller 210 begins offset calibration. The input of the variable-gain amplifier 202 is coupled to zero voltage. The controller 210 outputs a gain code representative of the first gain value ($G_1$) over the gain code output. The first multiplexer 206 passes the gain code to the variable-gain amplifier 202. The variable-gain amplifier 202 sets its gain in accordance with the gain code to the first gain value ($G_1$). Alternatively, the first multiplexer 206 may pass a gain code from the external circuit depending on the gain selection signal (Gain_Sel). The controller 210 then samples the first digital signal ($D1_{out}$) at the output of the analog-to-digital converter 204.

The controller 210 outputs a gain code representative of the second gain value ($G_2$) over the gain code output. The first multiplexer 206 passes the gain code to the variable-gain amplifier 202. The variable-gain amplifier 202 sets its gain in accordance with the gain code to the second gain value ($G_2$). The controller 210 then samples the second digital signal ($D2_{out}$) at the output of the analog-to-digital converter 204.

The controller 210 determines an offset code corresponding to the compensating offset ($O_C$) based on the difference between the first digital signal ($D1_{out}$) and the second digital signal ($D2_{out}$) ($D2_{out}$–$D1_{out}$) The controller 210 outputs the offset code over the offset code output. The variable-gain amplifier 202 receives the offset code over the offset control input. The variable-gain amplifier 202 adds, to the analog signal ($A_{in}$), a compensating offset ($O_C$) corresponding to the offset code. After calibration is performed, the controller 210 asserts the signal (VGA_CALDONE) indicating that offset calibration has been performed. The controller 210 outputs the signal (VGA_CALDONE) over the calibration completion output.

The gain code and offset code may be binary codes. For instance, the gain code may be a three-bit binary code thereby allowing for representing eight gains, and the offset code may be a four-bit binary code thereby allowing for representing sixteen compensating offsets. The compensating offsets may range from negative to positive values. Accordingly, the controller 210 may neutralize and compensate for positive and negative first offsets ($O_V$).

The first digital signal ($D1_{out}$) and second digital signal ($D2_{out}$) are stored in the memory 212 during calibration. The offset codes are changed using a counter. The digital techniques described herein described minimize the value $D1_{out}$-$D2_{out}$ independently of the offset of the amplifier. The table is an example for a particular offset values provided by the example VGA circuit. The amplifier may or may not know the table.

Table 1 shows an example of the gain codes, in an embodiment. Eight gain codes are shown that are between 0 and 7. Each gain code represents a gain ($G_V$) of the variable-gain amplifier 202. In Table 1, the gains ($G_V$) are also shown in decibels (dB).

Table 2 shows an example of the offset codes. Sixteen offset codes are shown that are between 0 and 15. Each offset code represents a compensating offset value in millivolts (mVs). For instance, offset code 6 represents a compensating offset of 0.4 mV, whereas offset code 10 represents a compensating offset of -0.4 mV. Accordingly, if the controller 210 determines that the first offset ($O_V$) is positive, the controller 210 may issue offset code 10 to the variable-gain amplifier 202 to mitigate the first offset ($O_V$) with a negative compensating offset. Conversely, if the controller 210 determines that the first offset ($O_V$) is negative, the controller 210 may issue offset code 6 to the variable-gain amplifier 202 to mitigate the first offset ($O_V$) with a positive compensating offset. As described herein, the magnitude of the compensating offsets ($O_C$) may depend on the magnitude the difference between the first digital signal ($D1_{out}$) and the second digital signal ($D2_{out}$) (|$D2_{out}$-$D1_{out}$|). A greater magnitude of the difference may be indicative of a larger first offset ($O_V$), and, accordingly, the controller 210 may issue an offset code corresponding to a larger compensating offsets ($O_C$).

TABLE 1

| Gain word | Gain (dB) | Gain |
|---|---|---|
| 0 | 11 | 3.548134 |
| 1 | 14 | 5.011872 |
| 2 | 17 | 7.079458 |
| 3 | 20 | 10 |
| 4 | 23 | 14.12538 |
| 5 | 26 | 19.95262 |
| 6 | 29 | 28.18383 |
| 7 | 32 | 39.81072 |

TABLE 2

| Offset code (digital) | Offset correction (mV) |
|---|---|
| 0 | 1.6 |
| 1 | 1.4 |
| 2 | 1.2 |
| 3 | 1 |
| 4 | 0.8 |
| 5 | 0.6 |
| 6 | 0.4 |
| 7 | 0.2 |
| 8 | 0 |
| 9 | -0.2 |
| 10 | -0.4 |
| 11 | -0.6 |
| 12 | -0.8 |
| 13 | -1 |
| 14 | -1.2 |
| 15 | -1.4 |

The controller 210 may iteratively adjust the offset code (and corresponding compensating offset ($O_C$)). The controller 210 may perform iterative adjustment until the magnitude of the difference between the first digital signal ($D1_{out}$) and the second digital signal ($D2_{out}$) (|$D2_{out}$-$D1_{out}$|) is minimized. The iterative adjustment may be additive, whereby the offset correction corresponding to an earlier code is added to the offset correction corresponding to a newer or more recent code. It is noted that the first offset ($O_V$) is compensated independently of the second offset ($O_A$) and the gain ($G_A$).

FIG. 3A shows an example of iterative compensating offset adjustment. The analog-to-digital converter 204 is a 12-bit analog-to-digital converter. Accordingly, the difference ($\Delta D$) may have one of 4095 levels; 2047 of which are positive, 2047 of which are negative and one represents a difference of zero. As shown in FIG. 3A, the difference ($\Delta D$) has a negative value. Offset code 8, which corresponds to a compensating offset ($O_C$) of 0 mV, does not result in a change in the difference between the first digital signal and the second digital signal ($\Delta D$). However, a positive compensating offset ($O_C$) (offset codes 0-7) results in reducing the magnitude of the difference (|$\Delta D$|) and shifts $\Delta D$ toward positive value and a target of zero volts. In response to the controller 210 issuing offset code (corresponding to a compensating offset ($O_C$) of 0.4 mV, the magnitude of the difference (|$\Delta D$|) shifts closer to zero volts. The controller 210 may iteratively adjust the compensating offset ($O_C$). With each adjustment, the compensating offset ($O_C$) is added to the analog signal ($A_{in}$) and the controller 210 determines the difference ($\Delta D$). For example, the controller 210 may use offset code 4 to further increase the compensating offset ($O_C$) and reduce the difference ($\Delta D$). The controller 210 may continue to adjust the offset code until the difference ($\Delta D$) converges on zero volts.

FIG. 3B shows an example of iterative compensating offset adjustment. The difference ($\Delta D$) is a positive voltage. Offset code 8, which corresponds to a compensating offset ($O_C$) of 0 mV, does not result in a change in the difference ($\Delta D$). Offset code 10 (corresponding to a compensating offset ($O_C$) of -0.4 mV) reduces the magnitude of the difference (|$\Delta D$|). The controller 210 may continue to adjust the offset code until controller the difference ($\Delta D$) converges on zero volts.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An analog front-end system, comprising:
   a variable-gain amplifier having:
      an input configured to receive an analog signal;
      a gain control input;
      a DC offset control input; and
      an output;
   an analog-to-digital converter having an input coupled to the output of the variable-gain amplifier and an output configured to provide a digital signal; and
   a controller configured to calibrate the variable-gain amplifier by at least:
      setting, via the gain control input of the variable-gain amplifier, a gain of the variable-gain amplifier to a first gain value;
      in response to setting the gain to the first gain value, determining a first digital signal output by the analog-to-digital converter;
      setting, via the gain control input of the variable-gain amplifier, the gain of the variable-gain amplifier to a second gain value;
      in response to setting the gain to the second gain value, determining a second digital signal output by the analog-to-digital converter;
      determining a difference between the first digital signal and the second digital signal; and
      setting, via the DC offset control input of the variable-gain amplifier, a compensating offset of the variable-gain amplifier based on the difference between the first digital signal and the second digital signal.

2. The analog front-end system of claim 1, wherein the controller configured to calibrate the variable-gain amplifier by at least:
   setting the analog signal to zero volts;
   in response to setting the analog signal to zero volts and setting the gain to the first gain value, determining the first digital signal output by the analog-to-digital converter; and
   in response to setting the analog signal to zero volts and setting the gain to the second gain value, determining the second digital signal output by the analog-to-digital converter.

3. The analog front-end system of claim 1, comprising:
   memory coupled to the controller and configured to:
      store a plurality of gain codes respectively corresponding to a plurality of gain values; and
      store a plurality of offset codes respectively corresponding to a plurality of compensating offset values.

4. The analog front-end system of claim 3, wherein the controller is configured to set the gain of the variable-gain amplifier to the first gain value by:
   selecting a first gain code of the plurality of gain codes that corresponds to the first gain value; and
   outputting the first gain code to the variable-gain amplifier.

5. The analog front-end system of claim 3, wherein the controller is configured to set the compensating offset of the variable-gain amplifier by:
   selecting an offset code of the plurality of offset codes that corresponds to the compensating offset; and
   outputting the offset code to the variable-gain amplifier.

6. The analog front-end system of claim 1, wherein the variable-gain amplifier is configured to, after calibration and during operation, add the compensating offset to the analog signal.

7. The analog front-end system of claim 1, wherein the controller is configured to set the compensating offset to a value that reduce an absolute value of the difference between the first digital signal and the second digital signal.

8. The analog front-end system of claim 1, wherein the controller is configured to iteratively adjust the compensating offset to minimize an absolute value of the difference between the first digital signal and the second digital signal.

9. The analog front-end system of claim 1, wherein the analog-to-digital converter includes an offset calibration input configured to receive a signal indicative of whether offset calibration is to be performed.

10. The analog front-end system of claim 1, wherein the controller includes a calibration completion output configured to output a signal indicative of whether offset calibration has been performed by the controller.

11. A method, comprising:
    setting, by a controller, a gain of a variable-gain amplifier of an analog front-end system to a first gain value via a gain control input of the variable-gain amplifier;
    in response to setting the gain to the first gain value, determining a first digital signal output by an analog-to-digital converter of the analog front-end system;
    setting the gain of the variable-gain amplifier to a second gain value via the gain control input of the variable-gain amplifier;
    in response to setting the gain to the second gain value, determining a second digital signal output by the analog-to-digital converter;
    determining a difference between the first digital signal and the second digital signal; and
    setting, via a DC offset control input of the variable-gain amplifier, a compensating offset of the variable-gain amplifier based on the difference between the first digital signal and the second digital signal.

12. The method of claim 11, wherein comprising:
    setting an analog signal to zero volts;
    in response to setting the analog signal to zero volts and setting the gain to the first gain value, determining the first digital signal output by the analog-to-digital converter; and
    in response to setting the analog signal to zero volts and setting the gain to the second gain value, determining the second digital signal output by the analog-to-digital converter.

13. The method of claim 11, comprising:
    storing, by a memory, a plurality of gain codes respectively corresponding to a plurality of gain values; and
    storing, by the memory, a plurality of offset codes respectively corresponding to a plurality of compensating offset values.

14. The method of claim 13, wherein setting the gain of the variable-gain amplifier to the first gain value includes:
    selecting a first gain code of the plurality of gain codes that corresponds to the first gain value; and
    outputting the first gain code to the variable-gain amplifier.

15. The method of claim 13, wherein setting the compensating offset of the variable-gain amplifier includes:

selecting an offset code of the plurality of offset codes that corresponds to the compensating offset; and outputting the offset code to the variable-gain amplifier.

16. The method of claim 11, comprising:

after calibration and during operation of the variable-gain amplifier, adding, by the variable-gain amplifier, the compensating offset to the analog signal.

17. A controller for an analog front-end system, comprising:

a gain output configured to output a gain to a variable-gain amplifier of the analog front-end system;

an offset output configured to output a compensating offset to the variable-gain amplifier, wherein the controller is configured to calibrate the variable-gain amplifier by at least:

setting a gain of the variable-gain amplifier to a first gain value via a gain control input of a variable-gain amplifier;

outputting the first gain value over the gain output;

in response to outputting the first gain value, determining a first digital signal output by an analog-to-digital converter;

setting the gain of the variable-gain amplifier to a second gain value via the gain control input of a variable-gain amplifier;

outputting the second gain value over the gain output;

in response to outputting the second gain value, determining a second digital signal output by the analog-to-digital converter;

determining a difference between the first digital signal and the second digital signal;

setting, via a DC offset control input of the variable-gain amplifier, a compensating offset of the variable-gain amplifier based on the difference between the first digital signal and the second digital signal; and outputting the compensating offset over the offset output.

18. The controller of claim 17, wherein the controller configured to calibrate the variable-gain amplifier by at least:

setting the analog signal to zero volts;

in response to setting the analog signal to zero volts and outputting the first gain value, determining the first digital signal output by the analog-to-digital converter; and in response to setting the analog signal to zero volts and outputting the second gain value, determining the second digital signal output by the analog-to-digital converter.

19. The controller of claim 17, wherein the controller is coupled to a memory configured to:

store a plurality of gain codes respectively corresponding to a plurality of gain values; and store a plurality of offset codes respectively corresponding to a plurality of compensating offset values.

20. The controller of claim 19, wherein the controller is configured to set the gain of the variable-gain amplifier to the first gain value by:

selecting a first gain code of the plurality of gain codes that corresponds to the first gain value; and outputting the first gain code to the variable-gain amplifier.

* * * * *